(12) United States Patent
Chen et al.

(10) Patent No.: US 9,167,717 B2
(45) Date of Patent: Oct. 20, 2015

(54) CONNECTION DEVICE FOR CABLE MANAGEMENT ARM AND SLIDE ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chiang-Hsueh Fang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/336,011

(22) Filed: Jul. 21, 2014

(65) Prior Publication Data
US 2014/0328618 A1 Nov. 6, 2014

Related U.S. Application Data

(63) Continuation-in-part of application No. 13/417,464, filed on Mar. 12, 2012, now Pat. No. 8,833,715.

(51) Int. Cl.
*A47F 1/10* (2006.01)
*A47H 5/00* (2006.01)
*H05K 7/14* (2006.01)

(52) U.S. Cl.
CPC ........... *H05K 7/1491* (2013.01); *Y10T 403/608* (2015.01)

(58) Field of Classification Search
CPC .......................... H05K 7/1491; Y10T 403/608
See application file for complete search history.

(56) References Cited

U.S. PATENT DOCUMENTS

| | | | |
|---|---|---|---|
| 7,023,708 B2 | 4/2006 | Nguyen et al. | |
| 7,473,846 B2 | 1/2009 | Doerr et al. | |
| 7,746,667 B1 | 6/2010 | Baiza et al. | |
| 8,833,715 B2 * | 9/2014 | Chen et al. ................ | 248/298.1 |
| 2009/0014601 A1 | 1/2009 | Chen et al. | |
| 2009/0065658 A1 | 3/2009 | Chen et al. | |

* cited by examiner

*Primary Examiner* — Amy Sterling
(74) *Attorney, Agent, or Firm* — Rosenberg, Klein & Lee

(57) ABSTRACT

A connection device includes a connection member attached to one of a cable management arm and a slide assembly, an insertion piece attached to the other one of the cable management arm and the slide assembly, and an engaging member attached to one of the connection member and the insertion piece. The connection member has a longitudinal passage and a window. The engaging member has a resilient arm and an engaging portion. The insertion piece has two insertion arms, one of which has a contact section located corresponding to the engaging portion, and a projecting portion for ensuring the insertion piece being inserted into the connection member in proper orientation. When the insertion piece is completely inserted into the longitudinal passage of the connection member, the engaging portion of the engaging member contacts the contact section to releasably lock the insertion piece to the connection member.

4 Claims, 15 Drawing Sheets

CONNECTION DEVICE FOR CABLE MANAGEMENT ARM AND SLIDE ASSEMBLY

CROSS-REFERENCE TO RELATED APPLICATIONS

This application is a continuation-in-part of U.S. patent application Ser. No. 13/417,464, filed Mar. 12, 2012, currently pending.

FIELD OF THE INVENTION

The present invention relates to a connection device, and more particularly, to connection device for a cable management arm and a slide assembly, and the connection device occupies less space and can be operated from two sides thereof.

BACKGROUND OF THE INVENTION

U.S. Pat. No. 7,473,846 to Doerr discloses a reversible cable support arm and FIG. 7 of the disclosure discloses a cable support arm 24 connected to the rails 108 and a mounting bracket 92 is connected to an end of the cable support arm 24. The lower portion 100 of the mounting bracket 92 has multiple keyhole slots 94 and a plunger 98. The connection between the rails and the cable support arm 24 is made by inserting the plungers 98, 132 to holes of the corresponding objects.

However, the plungers 98, 132 protrude beyond the chassis and which restrict the width and space when the chassis is installed in the rack. When the cable support arm is removed from the rails, the plungers provide only one removal direction. This restriction of direction, especially when the chassis is to be removed from the rack, from the storage position, the restriction of the available space makes it more difficult for pulling the plungers to release the connection between the cable support arm and the rails.

The present invention intends to provide a connection device between the cable management arm and the slide assembly, wherein the connection between the cable management arm and the slide assembly can be released from two sides.

SUMMARY OF THE INVENTION

An object of the present invention is to provide a connection device for a cable management arm and a slide assembly, wherein the connection device serves to separate the cable management arm and the slide assembly from each other in a two-way manner.

Another object of the present invention is to provide a connection device for a cable management arm and a slide assembly, wherein the connection device can ensure that the insertion piece is inserted into the connection member in a proper orientation.

According to one aspect of the present invention, the connection device comprises a connection member, an engaging member, and an insertion piece. The connection member is fixedly attached to the cable management arm. The connection member comprises a pair of bent portions and a sidewall connected between the bent portions. A longitudinal passage is defined by the bent portions and the sidewall. The sidewall has a window. The engaging member is attached to the sidewall of the connection member and has a longitudinally projecting resilient arm and an engaging portion protruding from the resilient arm, wherein the resilient arm extends to the window of the connection member. The insertion piece is attached to the slide assembly and has two insertion arms and a body connected between the two insertion arms. The thickness of each of the insertion arms is sized to match the width of the longitudinal passage so that the insertion arms can be detachably inserted into the longitudinal passage. At least one of the insertion arms has a contact section located corresponding to the engaging portion. When the insertion arms of the insertion piece are completely inserted into the longitudinal passage, the engaging portion of the engaging member is located between the body of the insertion piece and the contact section of the insertion arm to releasably lock the insertion piece to the connection member.

Preferably, the window is a T-shaped opening and has an enlarged hole and a narrow hole which communicates with a side of the enlarged hole. The sidewall has at least one stop which can contact with the insertion piece to restrict the depth that the insertion piece is inserted into the connection member.

Preferably, the engaging portion extends from the resilient arm and reaches the enlarged hole of the window.

Preferably, the engaging portion has a protruding contact piece which is located corresponding to the contact section. The contact section has a contact end. When the contact piece is in contact with the contact end, the insertion piece is positioned by the engaging member.

Preferably, the engaging portion has a bent section located in opposite to the contact piece. The bent section is located corresponding to one of the insertion arms which has an inclined guiding surface with which the bent section is slidably in contact.

Preferably, a two button is connected to the resilient arm of the engaging member.

According to another aspect of the present invention, the connection device comprises a connection member, an engaging member, and an insertion piece. The connection member has a pair of bent portions and a sidewall which is connected between the bent portions. A longitudinal passage is defined by the bent portions and the sidewall. The sidewall has a window and at least one stop. The window has an enlarged hole and a narrow hole which communicates with the enlarged hole and is located on one side of the enlarged hole. The engaging member is attached to the sidewall of the connection member and has a longitudinally projecting resilient arm and at least one engaging portion protruding from the resilient arm. The resilient arm extends from the narrow hole of the window and reaches the enlarged hole. The at least one engaging portion has a bent section. The insertion piece has two insertion arms and a body connected between the two insertion arms. The thickness of each of the insertion arms is sized to match the width of the longitudinal passage so that the insertion arms can be detachably inserted into the longitudinal passage. At least one of the insertion arms has a contact section located corresponding to the at least one engaging portion. The contact section has a contact end which is located corresponding to the at least one engaging portion. At least one of the insertion arm has an inclined guiding surface which is located corresponding to the bent section of the at least one engaging portion. When the insertion arms are inserted into the longitudinal passage of the connection member, the at least one engaging portion is lifted by the contact section; moreover, when the insertion piece is completely inserted into the longitudinal passage with one of the insertion arms contacting the stop, the contact section is separated from the at least one engaging portion of the engaging member, the at least one engaging portion of the engaging member returns to its initial position thereof, and the at least one engaging portion of the engaging member contacts the contact end of the contact section and thereby releasably lock the insertion piece to the connection member.

According to yet another aspect of the present invention, the connection device comprises a connection member, an engaging member, an insertion piece, and a contact end. The connection member is attached to one of the cable management arm and the slide assembly. The insertion piece is attached to the other one of the cable management arm and the slide assembly. The engaging member is attached to one of the connection member and the insertion piece and has a longitudinally projecting resilient arm and an engaging portion protruding from the resilient arm. The contact end is located on the other one of the connection member and the insertion piece. When the insertion piece is in connection with the connection member, the engaging portion of the engaging member contacts the contact end to releasably lock the insertion piece to the connection member.

Preferably, the connection member comprises a pair of bent portions and sidewall connected between the bent portions. A longitudinal passage is defined by the bent portions and the sidewall. The insertion piece has two insertion arms and a body connected between the two insertion arms. Each of the insertion arms has a first insertion portion, a second insertion portion extending from the first insertion portion, and a projecting portion protruding transversely from the second insertion portion. When the insertion arms are inserted into the longitudinal passage, the first insertion portions face the bent portions of the connection member while the second insertion portions are exposed outside of the longitudinal passage of the connection member. The projecting portion ensures that the insertion piece is inserted into the connection member in a proper orientation.

Preferably, each of the bent portions has a stop wall in opposite to the sidewall. Each said stop wall and the sidewall are spaced apart by a distance, and a sum of a thickness of the second insertion portion and a thickness of the projecting portion is greater than the distance.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
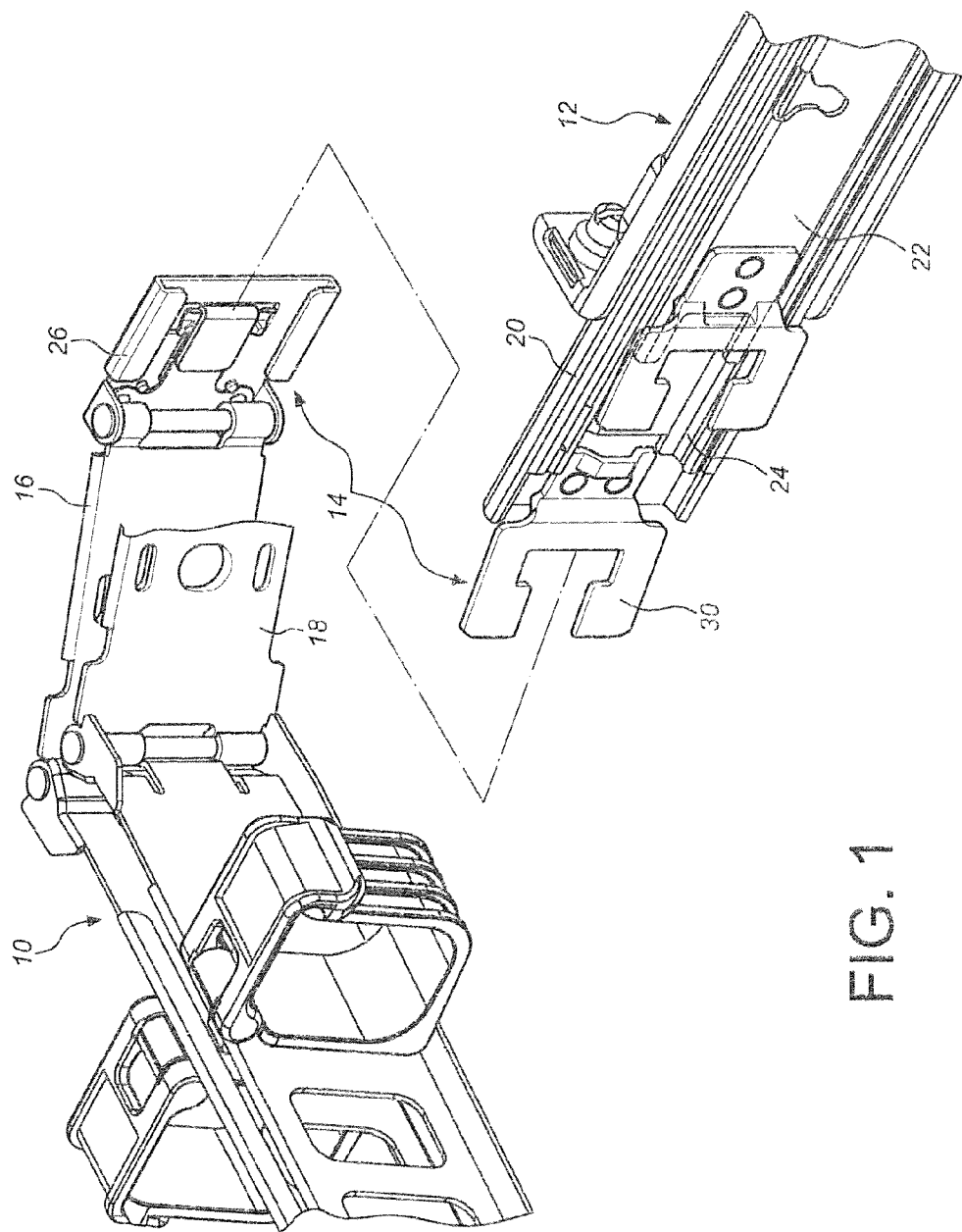
FIG. 1 shows that the connection device in a first embodiment of the present invention is cooperated with the cable management arm and the slide assembly.

Referring to FIG. 1, the preferred embodiment of the connection device 14 of the present invention is cooperated with a cable management arm 10 and a slide assembly 12. The cable management arm 10 comprises a first arm 16 and a second arm 18 which is pivotally connected to the first arm 16. The slide assembly 12 has a first rail 20 and a second rail 22 which is slidable relative to the first rail 20. Preferably, a third rail 24 is slid ably connected between the first and second rails 20, 22, so that the second rail 22 can be extended a further distance relative to the first rail 20 by the third rail 24.

Figure 2:
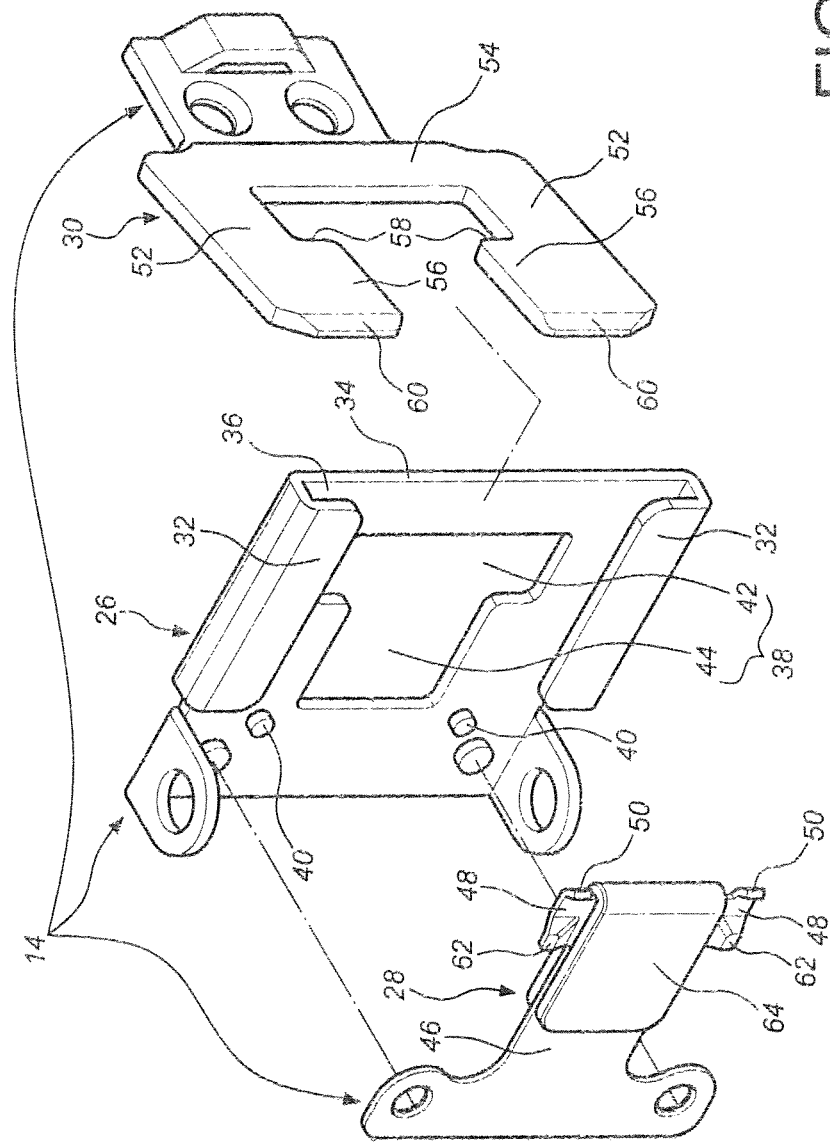
FIG. 2 is an exploded view to show the connection device in the first embodiment of the present invention.
Figure 3:
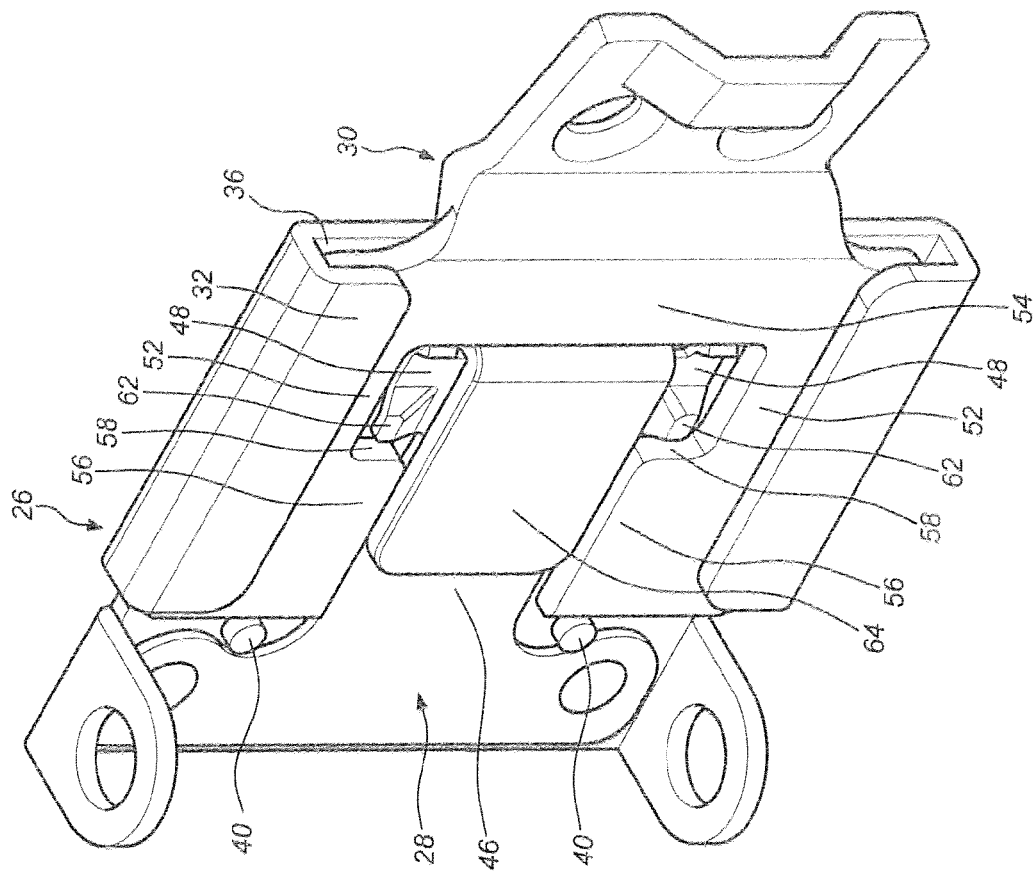
FIG. 3 is a perspective view of the connection device in the first embodiment of the present invention.

Referring to FIG. 2 and FIG. 3, the connection device 14 comprises a connection member 26, an engaging member 28, and an insertion piece 30.

The connection member 26 is fixedly attached to the cable management arm 10. As shown in FIG. 1, preferably, the connection member 26 is fixedly attached to one of the first and second arms 16, 18 of the cable management arm 10. The connection member 26 has a pair of bent portions 32 and a sidewall 34 connected between the bent portions 32. A longitudinal passage 36 is defined by the bent portions 32 and the sidewall 34. The sidewall 34 has a window 38 and one or a pair of stops 40. Preferably, the window 38 is a T-shaped opening and has an enlarged hole 42 and a narrow hole 44 which communicates with one side of the enlarged hole 42.

The engaging member 28 is attached to the sidewall 34 of the connection member 26 and has a longitudinally projecting resilient arm 46 and one or a pair of engaging portions 48 protruding from the resilient arm 46. The resilient arm 46 extends to the window 38 of the connection member 26. In more detail, the resilient arm 46 extends from the narrow hole 44 of the window 38 and reaches the enlarged hole 42. The engaging portion 48 extends from the resilient arm 46 and reaches the enlarged hole 42 of the window 38. Preferably, the engaging portion 48 has a bent section 50.

The insertion piece 30 is fixedly attached to the slide assembly 12. Further referring to FIG. 1, preferably, the insertion piece 30 is attached to one of the first rail 20 and the second rail 22 of the slide assembly 12. The insertion piece 30 has two insertion arms 52 and a body 54 which is connected between the two insertion arms 52. The thickness of each of the insertion arms 52 is sized to match the width of the longitudinal passage 36, and the insertion arms 52 are detachably inserted into the longitudinal passage 36. At least one of the insertion arms 52 has a contact section 56 located corresponding to the engaging portion 48. Preferably, the contact section 56 has a contact end 58. At least one of the insertion arms 52 has an inclined guiding surface 60 located corresponding to the bent section 50 of the engaging portion 48. Preferably, the engaging portion 48 has a protruding contact piece 62 located corresponding to the contact end 58. The bent section 50 is located in opposite to the contact piece 62 and located corresponding to one of the insertion arms 52 or the inclined guiding surface 60. More specifically, a plastic two-way button 64, which can be operated from both sides, is connected to the resilient arm 46 of the engaging member 28.

Figure 4:
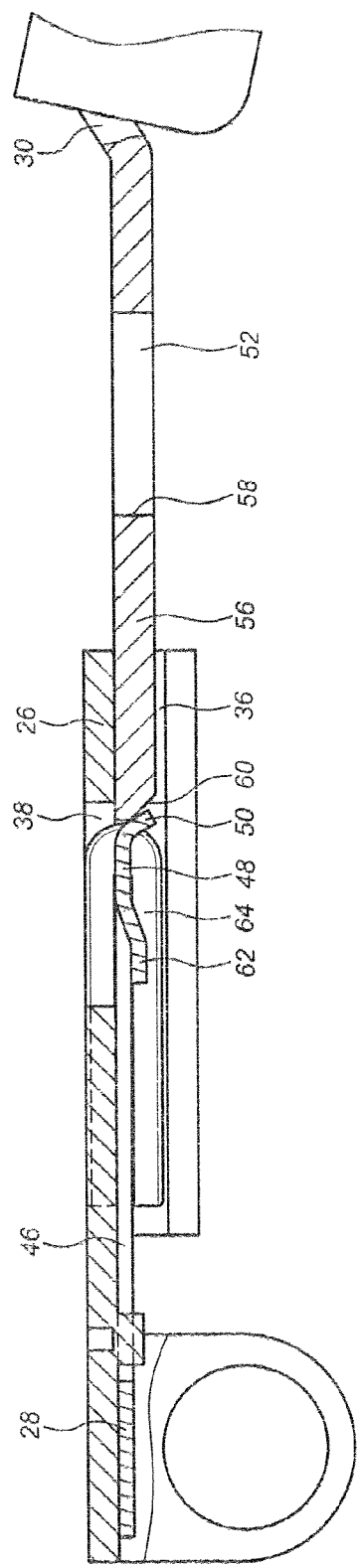
FIG. 4 shows the action that the insertion piece is inserted into the connection member according to the first embodiment of the present invention.
Figure 5:
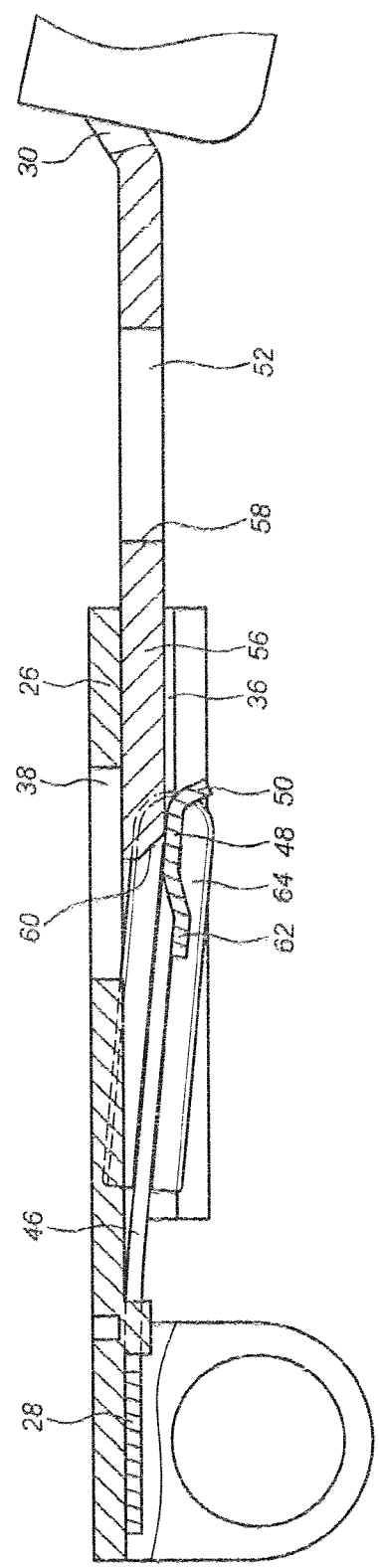
FIG. 5 shows another action that the insertion piece is inserted into the connection member according to tie first embodiment of the present invention.
Figure 6:
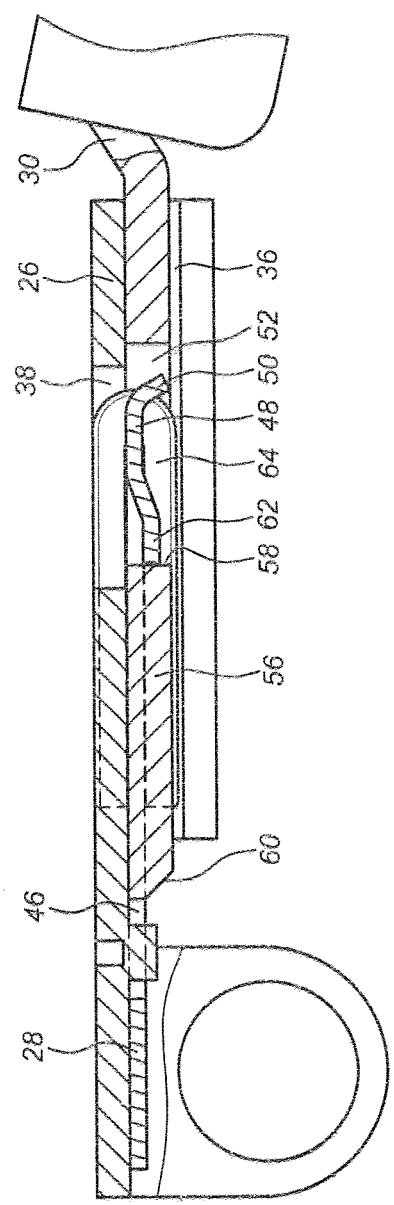
FIG. 6 is a schematic view shows that the insertion piece is engaged with the engaging member according to the first embodiment of the present invention.
Figure 7:
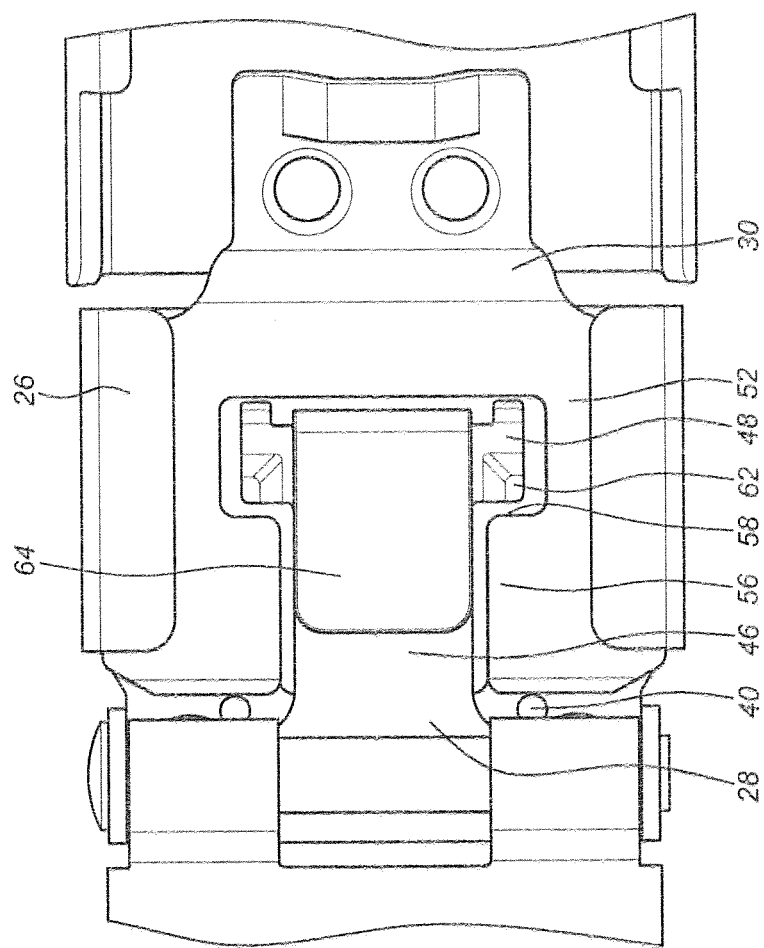
FIG. 7 is another schematic view shows that the insertion piece is engaged with the engaging member according to the first embodiment of the present invention.

As shown in FIGS. 4 and 5, when the insertion arms 52 of the insertion piece 30 are inserted into the longitudinal passage 36, the bent section 50 of the engaging portion 48 of the engaging member 28 is guided by the inclined guiding surface 60 of the insertion arm 52 and pushed by the contact section 56 so that the engaging portion 48 of the engaging member 28 is in contact with the contact section 56 of the insertion arm 52 by the resilient force from the resilient arm 46. Moreover, along with the insertion of the insertion piece 30 further into the longitudinal passage 36 of the connection member 26 toward the engaging member 28, the engaging portion 48 is kept lifted by the contact section 56 until the contact section 56 of the insertion arm 52 is completely inserted into the longitudinal passage 36 of the connection member 26. After that, as shown in FIGS. 6 and 7, the engaging portion 48 of the engaging member 28 is separated from and no longer lifted by the contact section 56, the resilient force from the resilient arm 46 of the engaging member 28 is released to return the engaging portion 48 to its initial position, and the engaging portion 48 thus contacts (or corresponds in position to) the contact end 58 of the contact section 56. Therefore, should the connection member 26 and the engaging member 28 be pulled in opposite directions, the contact piece 62 of the engaging portion 48 of the engaging member 28 will be pressed against the contact end 58 of the contact section 56 of the insertion arm and thus make the engaging portion 48 of the engaging member 28 be restricted between the body 54 and the contact section 56 of the insertion piece 30, thereby preventing the insertion arms 52 of the insertion piece 30 from being unintentionally removed from the longitudinal passage 36 of the connection member 26. The insertion piece 30 is releasably locked to the connection member 26.

It is noted that, without the guidance of the bent section 50 of the engaging portion 48 and the inclined guiding surface 60 of the contact section 56, the insertion arms 52 of the insertion piece 30 still can be smoothly and completely inserted into the longitudinal passage 36 of the connection member 26 by a user pressing the two-way button 64 of the resilient arm 46 of the engaging member 28.

Furthermore, the stop 40 of the connection member 26 can contact the insertion piece 30 to restrict the depth that the insertion piece 30 is inserted into the connection member 26, thus allowing the engaging portion 48 of the engaging member 28 to be positioned at a pre-set position and to be properly engaged with the insertion piece 30.

Figure 8:
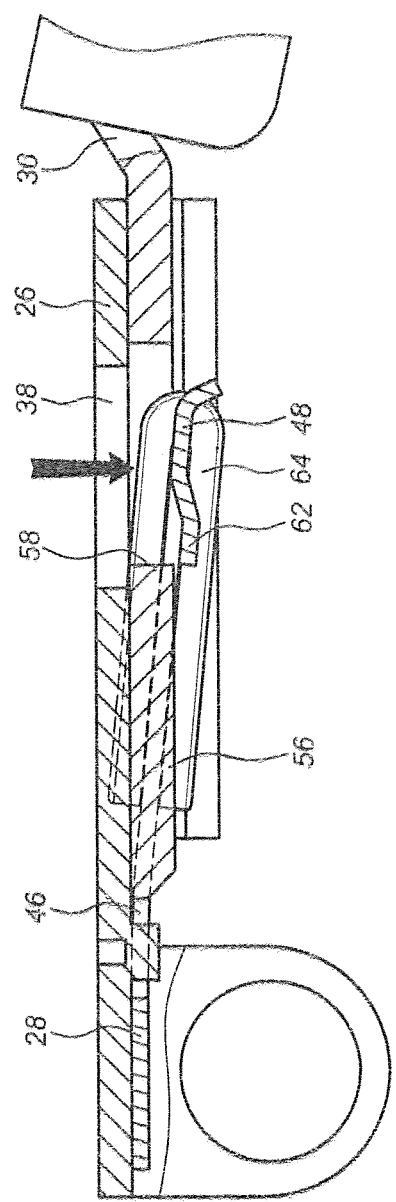
FIG. 8 shows the action that the insertion piece is disengaged from the engaging member according to the first embodiment of the present invention, wherein the engaging member in the status disclosed in FIG. 6 is released by being pressed in a first direction.
Figure 9:
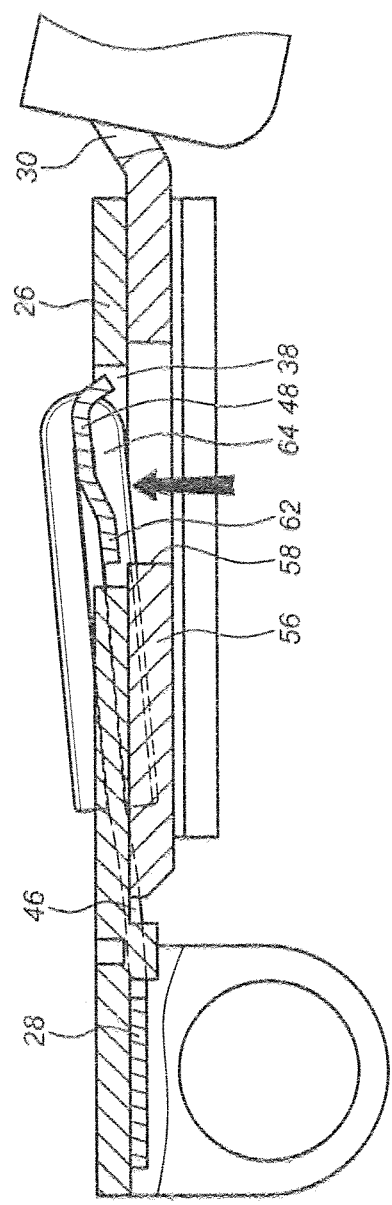
FIG. 9 shows another action that the insertion piece is disengaged from the engaging member according to the first embodiment of the present invention, wherein the engaging member in the status disclosed in FIG. 6 is released by being pressed in a second direction.

As shown in FIGS. 8 and 9, to remove the insertion piece 30 from the connection member 26, the two-way button 64 of the engaging member 28 is pressed from either side through the window 38 of the connection member 26 to elastically deform the resilient arm 46 of the engaging member 28, and thus the contact piece 62 of the engaging portion 48 of the engaging member 28 is moved away from and no longer stops the contact end 58 of the contact section 56. Consequently, the insertion piece 30 can be smoothly removed from the connection member 26.

The connection device provides convenient connection between the slide assembly 12 and the cable management arm 10; especially, the two-way button 64 of the engaging member 28 can be pressed from either side through the window 38 of the connection member 26 to release the connection between the slide assembly 12 and the cable management arm 10. Moreover, the connection device 14 uses the window 38 to accommodate parts to reduce the parts that protrude so as to be slim and thin, and occupy less space.

Figure 10:
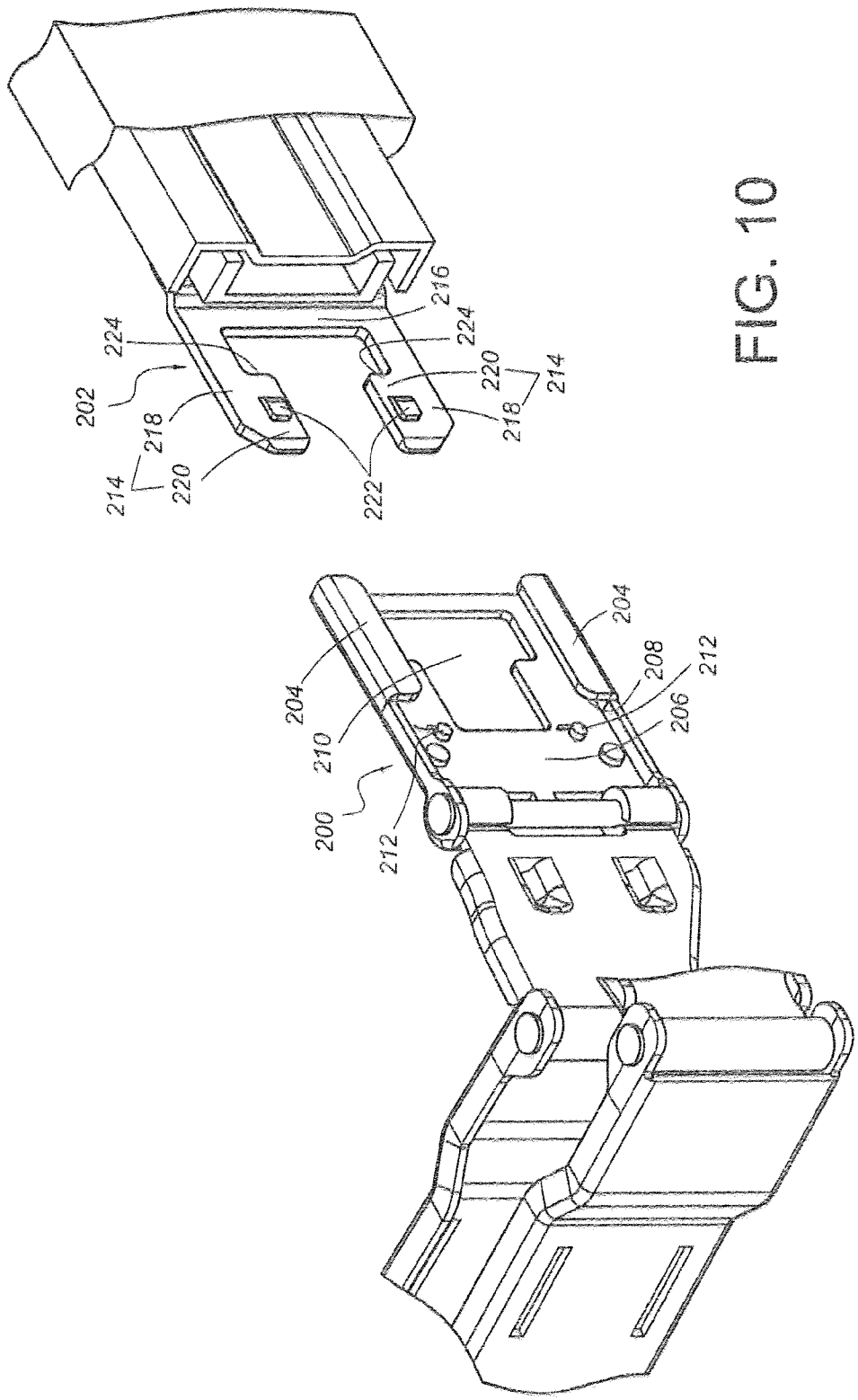
FIG. 10 shows that the insertion piece is disengaged from the engaging member according to a second embodiment of the present invention.
Figure 11:
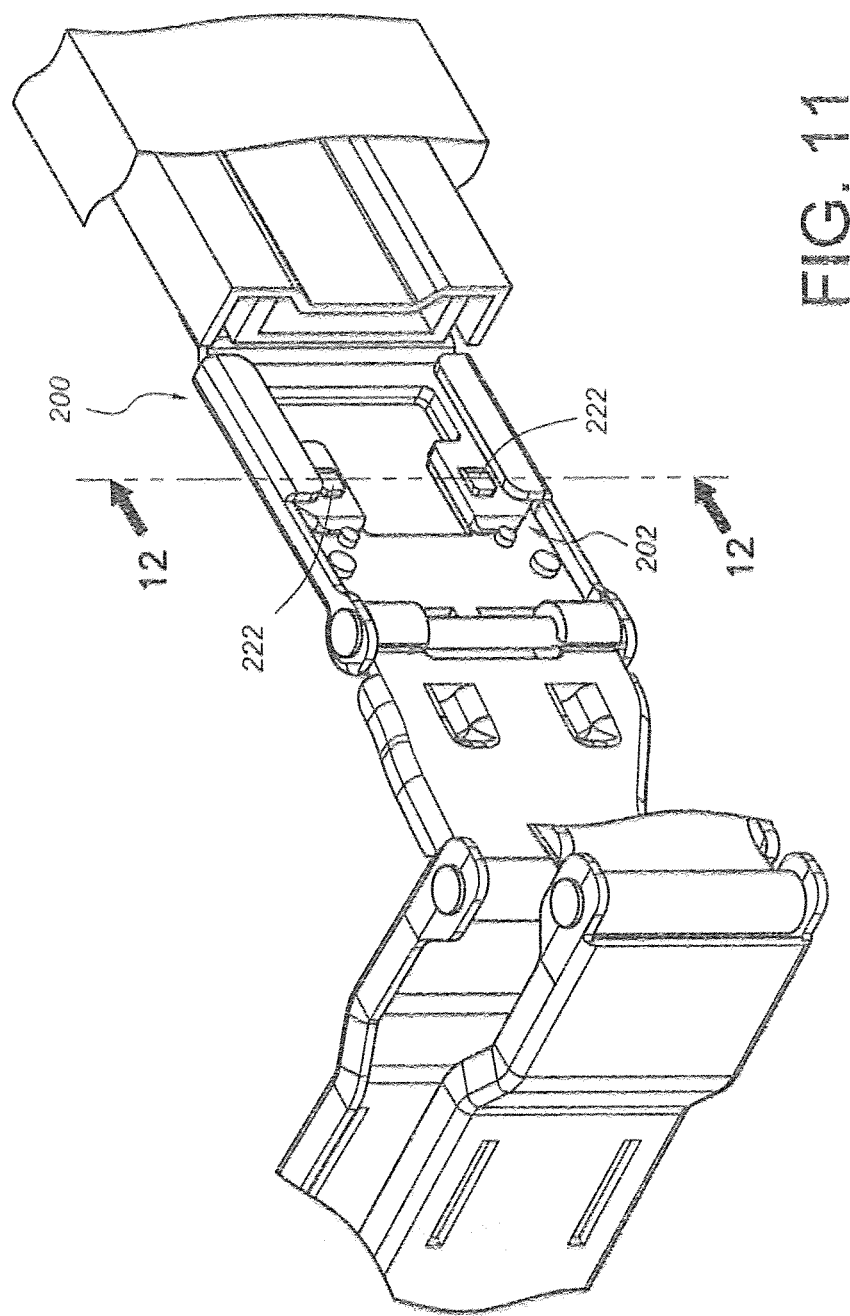
FIG. 11 is a perspective view shows that the insertion piece is assembled to the connection member according to the second embodiment of the present invention.
Figure 12:
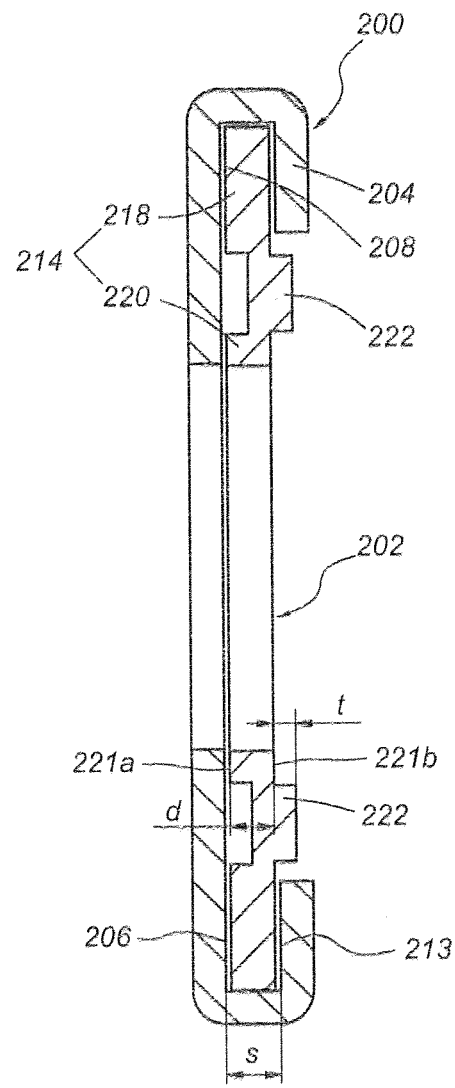
FIG. 12 is a section view connection device taken along line 12-12 in FIG. 11.

FIG. 10, FIG. 11, and FIG. 12 show a second embodiment of the connection device of the present invention, comprising a connection member 200 and an insertion piece 202.

The connection member 200 has substantially the same configuration as the aforementioned connection member 26. The connection member 200 has two bent portions 204 and a sidewall 206 connecting between the two bent portions 204. A longitudinal passage 208 is defined by the two bent portions 204 and the sidewall 206. The sidewall 206 has a window 210 and one or a pair of stops 212. Each of the bent portions 204 has a stop wall 213 facing the sidewall 206, wherein ach of the stop walls 213 is spaced apart from the sidewall 206 by a distance S.

The insertion piece 202 comprises a pair of insertion arms 214 and a body 216 connecting between the insertion arms 14. Each of the insertion arms 214 comprises a first insertion portion 218, a second insertion portion 220 extending from the first insertion portion 218, and a projecting portion 222. The second insertion portions 220 each have a first side 221a and a second side 221b opposite the first side 221a, wherein the projecting portion protrudes transversely from the second side 221b. When the insertion arms 214 are inserted into the longitudinal passage 208 of the connection member 200, the first insertion portion 218 of each insertion arm 214 faces the corresponding bent portion 204 of the connection member 200, the first side 221a of the second insertion portion 220 of each insertion arm 214 faces the sidewall 206 of the connection member 200, and the second side 221b of the second insertion portion 220 of each insertion arm 214 is exposed to outside of the longitudinal passage 208 of the connection member 200. In more detail, the second insertion portions 220 each have a thickness d, the projecting portions 222 each have a thickness t, and the sum of the thicknesses d and t is greater than the distance S. The first insertion portion 218 and the second insertion portion 220 of each insertion arm 214 jointly form a contact section wherein the contact section has a contact end 224.

Accordingly, the projecting portions 222 ensure that the insertion piece 202 is inserted into the connection member 200 in a proper orientation (as shown in FIG. 11). Should the insertion piece 202 is inserted into the connection member 200 that is rotated 180 degrees from the proper orientation horizontally, the insertion piece 202 will interfere with the connection member 200 via the projecting portions 222 of the insertion arms 214 and fail to be inserted into the connection member 200. Hence, the projecting portions 222 cooperate with the connection member 200 to provide poka-yoke, which can prevent the user from insetting the insertion piece 202 into the connection member 200 in a wrong orientation.

It is noted that the configuration of poka-yoke is not restricted to the illustrative example described above, In another embodiment, the sidewall 206 is provided with at least one projecting member, and the first side 221a of at least one of the insertion arms 214 is provided with a groove corresponding to the projecting member so that the projecting member of the sidewall 206 can cooperate with the groove of the insertion arm 214 to provide poka-yoke of another type.

Figure 13:
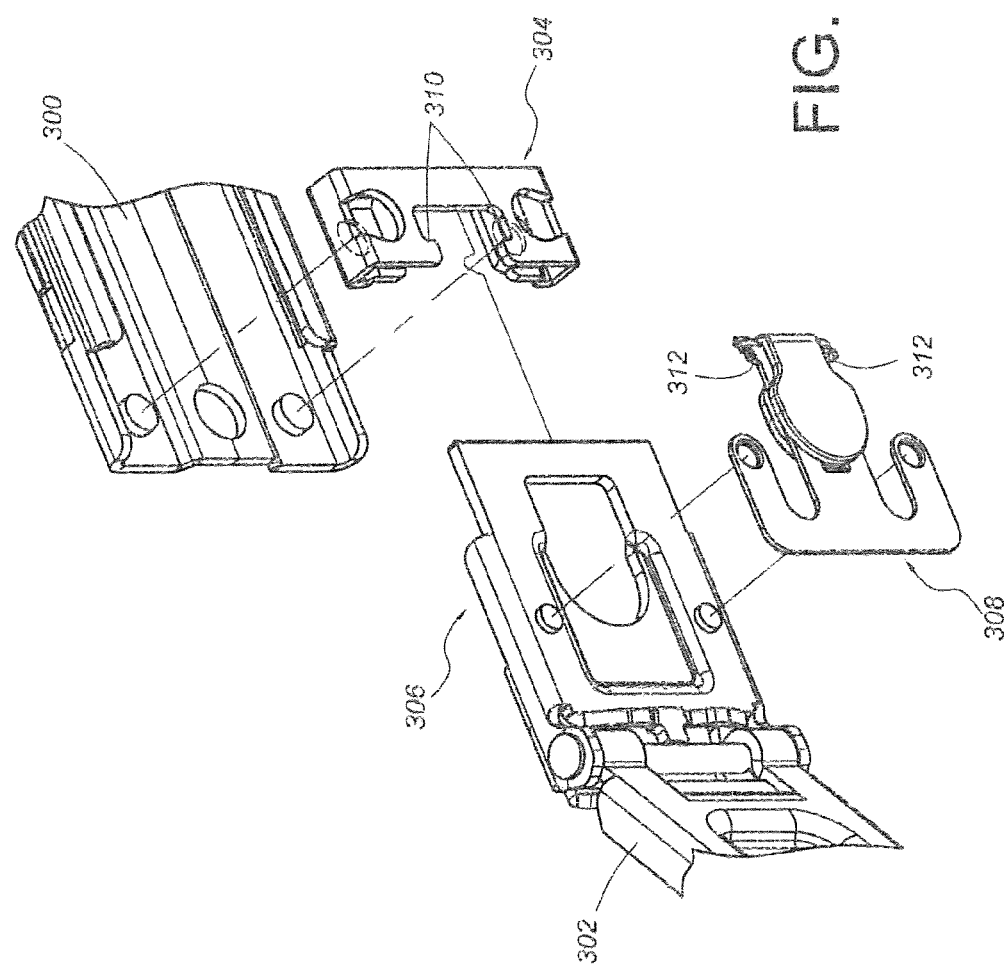
FIG. 13 is an exploded view of the connection device in a third embodiment of the present invention.
Figure 14:
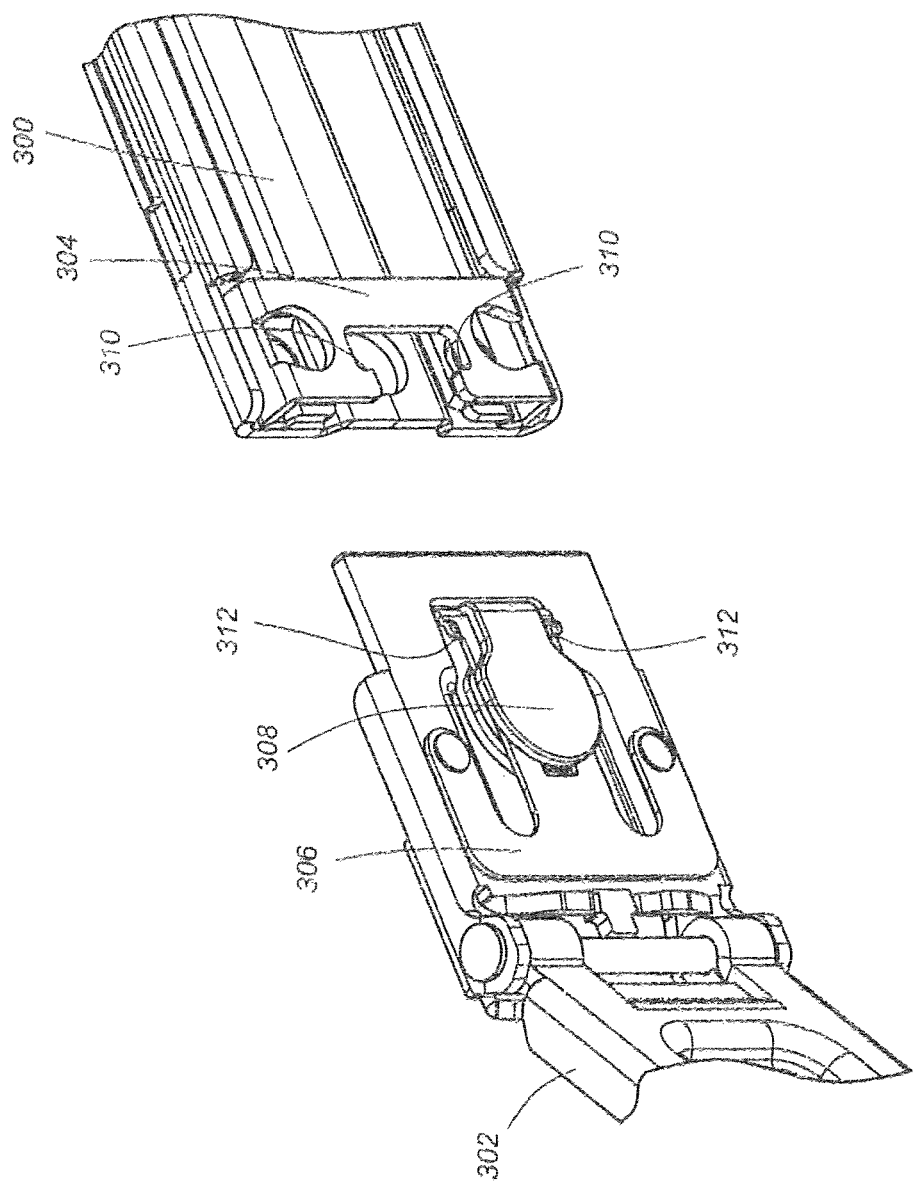
FIG. 14 shows that the connection member is disengaged from the insertion piece according to the third embodiment of the present invention.
Figure 15:
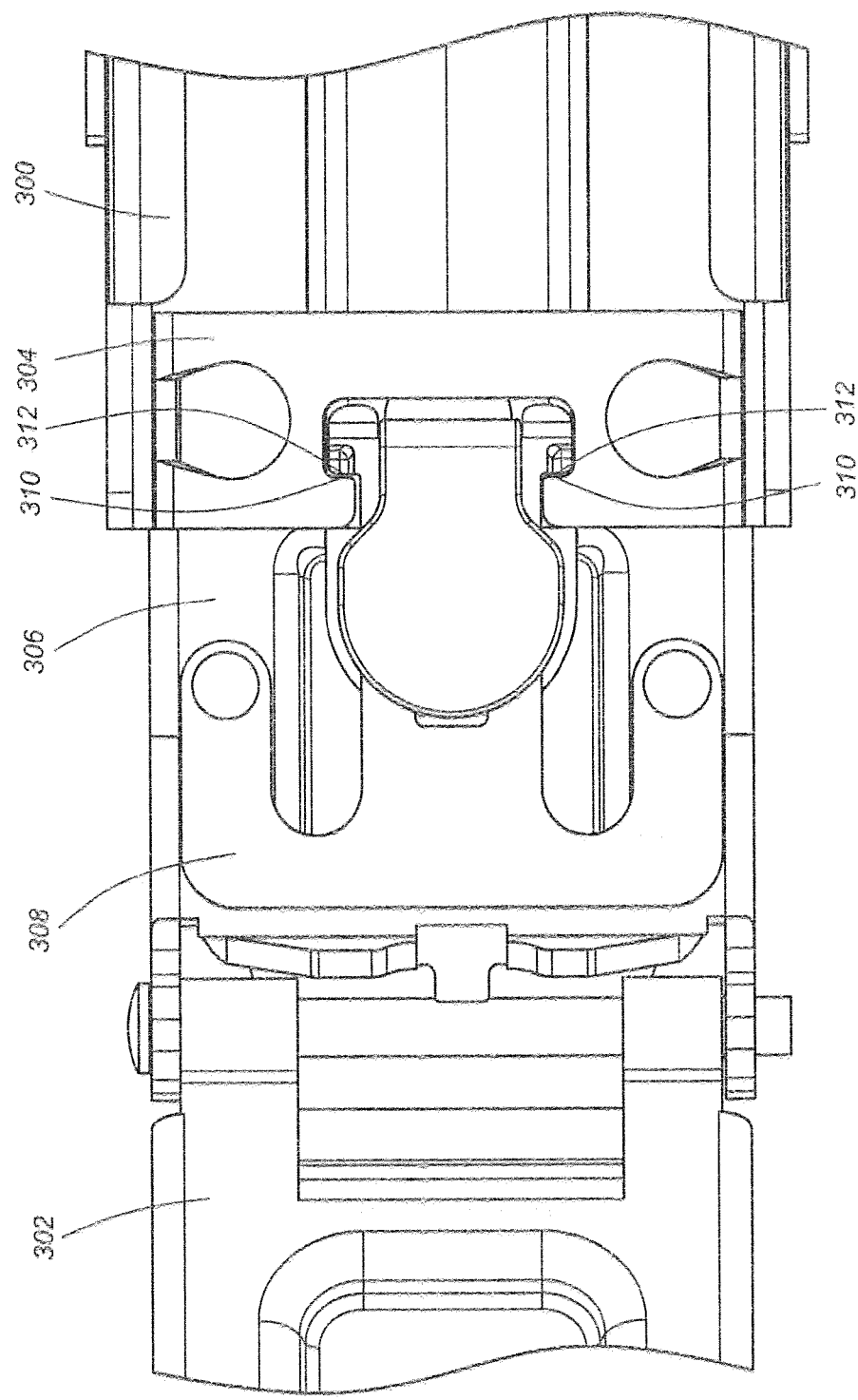
FIG. 15 is a perspective view shows that the connection member is assembled to the insertion piece according to the third embodiment of the present invention.

FIG. 13, FIG. 14, and FIG. 15 show a third embodiment of the present invention, comprising a rail 300 of a slide assembly, a cable management arm 302, a connection member 304, an insertion piece 306, and an engaging member 308. The connection member 304 is attached to the rail 300 of the slide assembly, the insertion piece 306 is attached to the cable management arm 302, and the engaging member 308 is attached to the insertion piece 306. More specifically, the connection member 304 is provided with at least one or a pair of contact ends 310; the engaging member 308 is provided with at least one or a pair of engaging portions 312 corresponding to the contact ends 310. When the insertion piece 306 is inserted into the connection member 304, the engaging portions 312 of the engaging member 308 contact the contact ends 310 of the connection member 304 to releasably lock the insertion piece 306 to the connection member 304.

According to the illustrative embodiments described above, it is clear that the connection member is attached to one of the slide assembly and the cable management arm, while the insertion piece is attached to the other one of the slide assembly and the cable management arm. Moreover, the engaging member is attached to one of the connection member and the insertion piece, while the contact ends, with which the engaging portions of the engaging member contact, are located on the other one of the connection member and the insertion piece.

While we have shown and described the embodiment in accordance with the present invention, it should be clear to those skilled in the art that further embodiments may be made without departing from the scope of the present invention.

What is claimed is:

1. A connection device for a cable management arm and a slide assembly, comprising:
    a connection member having a pair of bent portions and a sidewall extending between the bent portions, a longitudinal passage defined by the bent portions and the sidewall, the sidewall having a window and at least one stop, the window having an enlarged hole and a narrow hole which communicates with a side of the enlarged hole;
    an engaging member attached to the sidewall of the connection member, the engaging member having a longitudinally projecting resilient arm and at least one engaging portion protruding from the resilient arm, the resilient arm extending from the narrow hole of the window and reaching the enlarged hole, the at least one engaging portion having a bent section; and
    insertion piece detachably inserted into the longitudinal passage, insertion piece having two insertion arms, a body connected between the two insertion arms, and at least one projecting portion, the projecting portion ensuring that the insertion piece is inserted into the connection member in a proper orientation, a thickness of each of the insertion arms being sized to match a width of the longitudinal passage, at least one of the insertion arms having a contact section located corresponding to the at least one engaging portion, the contact section having a contact end located corresponding to the at least one engaging portion, at least one of the insertion arms having an inclined guiding surface located corresponding to the bent section of the at least one engaging portion;
    wherein, when the insertion arms are inserted into the longitudinal passage, the at least one engaging portion is lifted by the contact section; and when the insertion piece is completely inserted into the longitudinal passage with one of the insertion arms contacting the stop, the contact section is separated from the at least one engaging portion of the engaging member, the at least one engaging portion of the engaging member returns to an initial position thereof, and the at least one engaging portion of the engaging member contacts the contact end of the contact section and thereby releasably locks the insertion piece to the connection member.

2. A connection device for a cable management arm and a slide assembly, comprising:
    a connection member attached to one of the cable management arm and the slide assembly;
    an insertion piece attached to the other one of the cable management arm and the slide assembly;
    an engaging member attached to one of the connection member and the insertion piece, the engaging member having a longitudinally projecting resilient arm and an engaging portion protruding the resilient arm; and
    a contact end located on the other one of the connection member and the insertion piece;
    wherein, when the insertion piece is in connection with the connection member, the engaging portion of the engaging member contacts the contact end to releasably lock the insertion piece to the connection member.

3. The connection device as claimed in claim 2, wherein the connection member comprises a pair of bent portions and a sidewall connected between the bent portions; a longitudinal passage is defined by the bent portions and the sidewall; the insertion piece has two insertion arms and a body connected between the two insertion arms; each of the insertion arms has a first insertion portion, a second insertion portion extending from the first insertion portion, and a projecting portion protruding transversely from the second insertion portion; when the insertion arms are inserted into the longitudinal passage, the first insertion portions face the bent portions of the connection member while the second insertion portions are exposed outside of the longitudinal passage of the connection member; the projecting portion ensures that the insertion piece is inserted into the connection member in a proper orientation.

4. The connection device as claimed in claim 3, wherein each of the bent portions has a stop wall in opposite to the sidewall, each said stop wall and the sidewall are spaced apart by a distance, and a sum of a thickness of the second insertion portion and a thickness of the projecting portion of each said insertion arm is greater than the distance.

* * * * *